(12) United States Patent
San Antonio et al.

(10) Patent No.: US 7,943,431 B2
(45) Date of Patent: May 17, 2011

(54) LEADLESS SEMICONDUCTOR PACKAGE AND METHOD OF MANUFACTURE

(75) Inventors: Romarico S. San Antonio, Batam Island (ID); Anang Subagio, Batam Island (ID)

(73) Assignee: Unisem (Mauritius) Holdings Limited, Port Louis, Mauritius ( * ) Notice: Subject to any disclaimer, the term of this patent is extended or adjusted under 35 U.S.C. 154(b) by 302 days.

(21) Appl. No.: 11/590,726

(22) Filed: Oct. 31, 2006

(65) Prior Publication Data
US 2007/0126092 A1 Jun. 7, 2007

Related U.S. Application Data

(60) Provisional application No. 60/741,965, filed on Dec. 2, 2005.

(51) Int. Cl.
*H01L 21/00* (2006.01)
*H01L 23/495* (2006.01)
(52) U.S. Cl. ................ 438/123; 438/111; 257/666
(58) Field of Classification Search .......... 438/111, 438/123; 257/666
See application file for complete search history.

(56) References Cited

U.S. PATENT DOCUMENTS

| | | | | |
|---|---|---|---|---|
| 5,422,314 A * | 6/1995 | Sekiba | .................. | 29/827 |
| 5,466,966 A * | 11/1995 | Ito | .................. | 257/666 |
| 5,608,262 A | 3/1997 | Degani et al. | .................. | 257/723 |
| 5,973,388 A | 10/1999 | Chew et al. | | |
| 6,223,429 B1 | 5/2001 | Kaneda et al. | .................. | 29/832 |
| 6,242,281 B1 | 6/2001 | Mclellan et al. | | |
| 6,337,510 B1 | 1/2002 | Chun-Jen et al. | .................. | 257/666 |
| 6,400,004 B1 * | 6/2002 | Fan et al. | .................. | 257/666 |
| 6,403,398 B2 * | 6/2002 | Ohuchi et al. | .................. | 438/111 |
| 6,424,024 B1 * | 7/2002 | Shih et al. | .................. | 257/667 |
| 6,448,107 B1 * | 9/2002 | Hong et al. | .................. | 438/106 |
| 6,483,180 B1 * | 11/2002 | Bayan et al. | .................. | 257/684 |
| 6,489,218 B1 * | 12/2002 | Kim et al. | .................. | 438/460 |
| 6,498,099 B1 | 12/2002 | McLellan et al. | .................. | 438/689 |
| 6,521,987 B1 * | 2/2003 | Glenn et al. | .................. | 257/684 |
| 6,563,209 B1 * | 5/2003 | Takahashi | .................. | 257/692 |
| 6,605,865 B2 | 8/2003 | Jeong et al. | .................. | 257/670 |
| 6,608,366 B1 * | 8/2003 | Fogelson et al. | .................. | 257/666 |
| 6,700,186 B2 * | 3/2004 | Yasunaga et al. | .................. | 257/672 |
| 6,744,118 B2 | 6/2004 | Ikenaga et al. | .................. | 257/666 |

(Continued)

FOREIGN PATENT DOCUMENTS

JP 01-125963 * 5/1989

(Continued)

*Primary Examiner* — Matthew C Landau
*Assistant Examiner* — James M Mitchell
(74) *Attorney, Agent, or Firm* — Wiggin and Dana LLP

(57) ABSTRACT

A package to encase a semiconductor package is manufactured by the following steps. First, an electrically conductive frame is provided. This frame has a plurality of leadframes arranged in a matrix with each leadframe having a plurality of spaced leads extending outwardly from a central aperture. The electrically conductive frame further includes a plurality of connecting bars joining outer end portions of adjacent ones of the leadframes. Second, a groove is formed in the connecting bars to form a reduced thickness portion between the outer end portions of adjacent ones of the leadframes. Third, a semiconductor device is electrically coupled to inner portions of said leads. Fourth, the frame and the semiconductor devices are encapsulated in a molding compound. Finally, the molding compound and the frame are cut along the grooves to form singulated semiconductor packages having outer lead portions with a height greater than the height of the reduced thickness portion.

14 Claims, 6 Drawing Sheets

U.S. PATENT DOCUMENTS

| | | | |
|---|---|---|---|
| 6,812,552 B2 | 11/2004 | Islam et al. | 257/666 |
| 6,835,600 B2 * | 12/2004 | Utsumi et al. | 438/112 |
| 6,841,414 B1 * | 1/2005 | Hu et al. | 438/106 |
| 6,847,099 B1 * | 1/2005 | Bancod et al. | 257/666 |
| 6,872,599 B1 * | 3/2005 | Li et al. | 438/123 |
| 6,885,086 B1 * | 4/2005 | Fogelson et al. | 257/666 |
| 6,908,794 B1 * | 6/2005 | Chiang | 438/123 |
| 7,023,074 B2 * | 4/2006 | Li et al. | 257/666 |
| 7,060,536 B2 * | 6/2006 | Punzalan et al. | 438/123 |
| 7,153,724 B1 * | 12/2006 | Sirinorakul et al. | 438/112 |
| 2001/0030355 A1 * | 10/2001 | Mclellan et al. | 257/666 |
| 2001/0042904 A1 * | 11/2001 | Ikenaga et al. | 257/666 |
| 2002/0027273 A1 | 3/2002 | Huang | 257/678 |
| 2002/0079561 A1 * | 6/2002 | Yasunaga et al. | 257/670 |
| 2003/0038359 A1 | 2/2003 | Fujimoto et al. | 257/688 |
| 2003/0042581 A1 | 3/2003 | Fee et al. | 257/666 |
| 2003/0062606 A1 * | 4/2003 | Chun et al. | 257/666 |
| 2003/0132512 A1 * | 7/2003 | Yasuda et al. | 257/672 |
| 2003/0141577 A1 * | 7/2003 | Hung et al. | 257/676 |
| 2005/0023655 A1 * | 2/2005 | Fee et al. | 257/676 |
| 2005/0093118 A1 * | 5/2005 | Itou et al. | 257/676 |
| 2005/0116321 A1 * | 6/2005 | Li et al. | 257/666 |
| 2005/0258520 A1 * | 11/2005 | Dolan | 257/670 |
| 2006/0033184 A1 * | 2/2006 | Park et al. | 257/666 |
| 2007/0052070 A1 * | 3/2007 | Islam et al. | 257/666 |

FOREIGN PATENT DOCUMENTS

| | | | |
|---|---|---|---|
| JP | 01125963 | * | 5/1989 |
| JP | 03136270 | * | 6/1991 |
| WO | 03/105223 | | 12/2003 |
| WO | 2005/022591 | | 3/2005 |

* cited by examiner

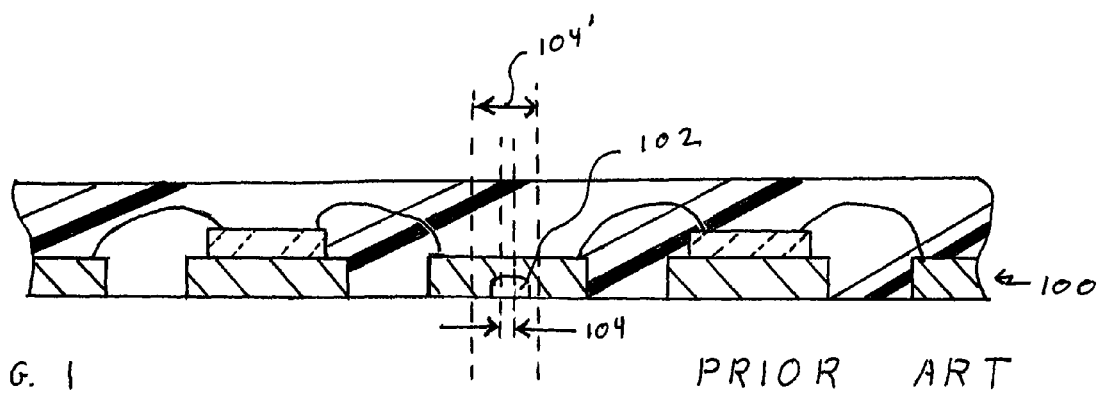
FIG. 1          PRIOR ART
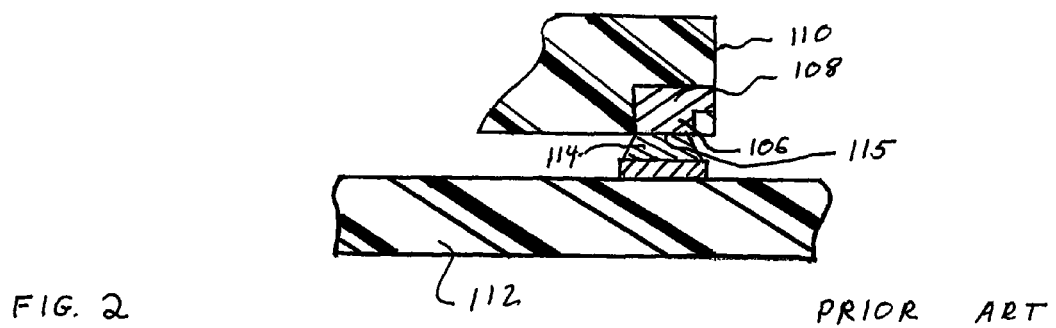
FIG. 2          PRIOR ART
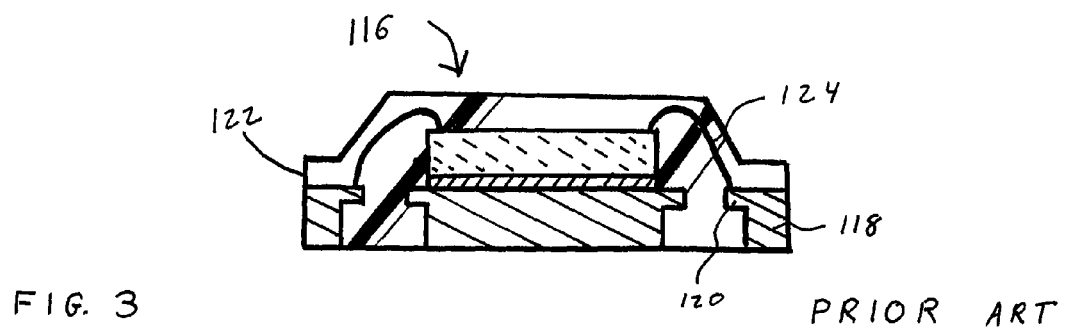
FIG. 3          PRIOR ART

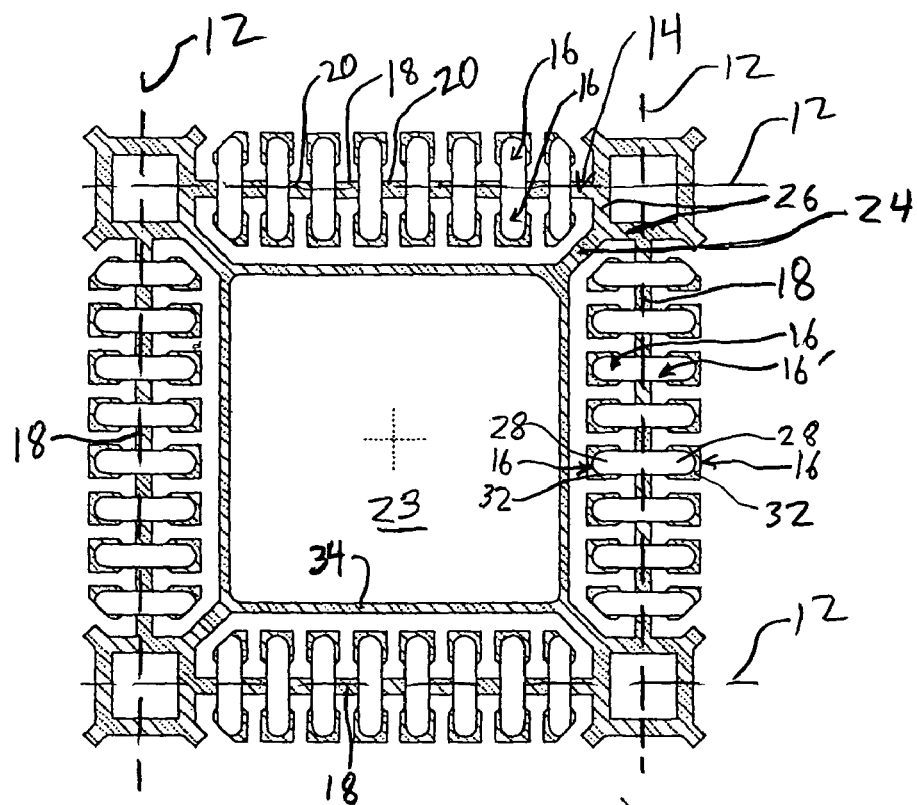
Fig-6 (Bottom)
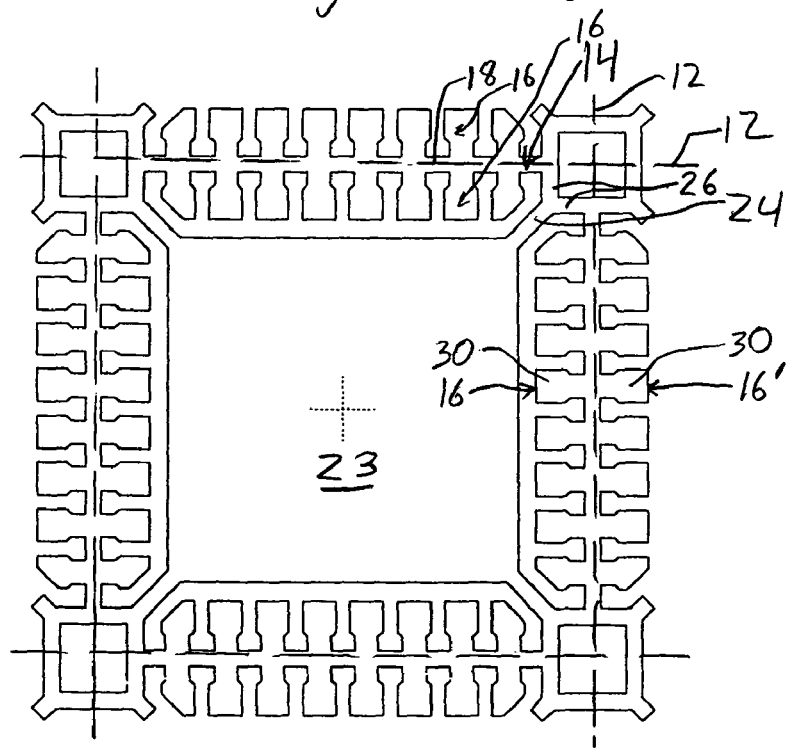
Fig-7 (Top)

US 7,943,431 B2

LEADLESS SEMICONDUCTOR PACKAGE AND METHOD OF MANUFACTURE

CROSS-REFERENCE TO RELATED APPLICATIONS

This patent application claims priority to U.S. Provisional Patent Application Ser. No. 60/741,965 that was filed on Dec. 2, 2005. The subject matter of provisional patent application U.S. 60/741,965 is incorporated by reference in its entirety herein.

BACKGROUND OF THE INVENTION

Field of the Invention

This invention relates to a leadless semiconductor package and a method to manufacture such a package. More particularly, the invention relates to a method to manufacture leadless semiconductor packages having reduced lead burrs and improved solder fillets.

Semiconductor device packages provide environmental protection to one or more integrated circuit devices, referred to as semiconductor dies, encased within the package. The semiconductor dies have input/output (I/O) pads electrically interconnected to inner lead portions of a leadframe or an interposer by wire bonds, tape bonds or the like. Opposing outer lead portions of the leadframe or interposer are electrically interconnected to circuits on a printed circuit board, flex circuit or other external circuitry. A polymer molding resin encases the semiconductor die and at least the inner lead portion of the leadframe or interposer.

When the outer lead ends of the leadframe or interposer terminate at a face of the package body and do not extend beyond the package footprint, the package is referred to as a "no-lead" or "leadless" semiconductor package. Conventional leadless packages include quad flat no-lead (QFN) packages having four sets of leads disposed around the perimeter of a bottom surface of a square package and dual flat no-lead (DFN) packages having two sets of leads disposed on opposing sides of the bottom of the package.

To facilitate the manufacture of certain leaded and leadless semiconductor packages, a matrix of leadframes is provided in sheet form. Such a matrix is referred to as a frame. During manufacture, a semiconductor die is attached to a die pad disposed within an aperture defined by the inner leads of a leadframe. The die is then electrically interconnected to the inner lead ends. When die are attached to each die pad and electrically interconnected to each leadframe making up a frame, the entire assembly is encapsulated by a molding resin. After the molding resin cures or otherwise hardens, individual packages are separated from the encapsulated frame by a process referred to as singulation.

One method of singulation is referred to as saw singulation. A saw is used to cut through the molding resin and the metallic leadframe. Because the molding resin is relatively hard and the metallic leadframe is relatively soft, the saw blade must cut through dissimilar materials and it is not possible to optimize the saw blade design for either material. Metallic debris from sawing adheres to the saw blade distorting the cut surface and reducing the usable life of the blade. Incomplete cutting of the leadframe results in the formation of burrs. A burr may extend from one outer lead end to a closely spaced adjacent outer lead end causing a short circuit.

One method to overcome difficulty with saw singulation is disclosed in U.S. Pat. No. 6,744,118 to Ikenaga et al. that is incorporated by reference in its entirety herein. With reference to FIG. 1, Ikenaga et al. disclose a leadframe 100 having a reduced thickness section 102 positioned along a saw track 104 or 104'. The leadframe is partially etched from one side to form the reduced thickness section 102. One side. etching is referred to in the art as "half-etching". The reference discloses that the width of the saw blade can not equal the width of the reduced thickness section because there are variations along the width of the etched section and cutting would not go smoothly. Accordingly, the saw blade width is selected to be either greater than the width of the reduced thickness section (saw track 104') or less than the width of the reduced thickness section (saw track 104). With saw track 104', the problems of sliver formation remains and debris formation, while reduced are still issues.

Selecting saw track 104 reduces the amount of metal that must be cut by the saw blade, reduces the accumulation of metallic debris on the saw blade and also reduces the number of burrs formed. FIG. 2 illustrates a disadvantage with this approach. A portion 106 of the outer edge of the lead 108 is recessed from the perimeter 110 of the molded plastic package body, a condition referred to as "pull-back." Pull-back results in reduced area for a contact with a printed circuit board 112 affecting mounting integrity. Further, a solder fillet 114 does not extend to the package perimeter 110 making inspection difficult. Still further, the surface area 115 at the base of the lead is reduced. During assembly, the leads are arranged side by side and supported by an adhesive tape. The wirebonding process applies force to the leads when bonding a gold bond wire. If this force is not controlled, the leads will bend. Since the force which can be applied to a "pull-back" lead is limited, the diameter of a gold wire that may be used for wirebonding is also limited.

Another approach to saw singulation is disclosed in U.S. Pat. No. 6,605,865 to Jeong et al. that is incorporated by reference in its entirety herein. As shown in FIG. 3, U.S. Pat. No. 6,605,865 discloses a package 116 having a leadframe 118 with a reduced thickness projection 120. A punch shears surface 122 singulating the package. However, the reduced thickness of the projection reduces the stability of the lead, making bonding of wires 124 more difficult. Shearing introduces stresses to the leads and package that may impact reliability by causing delamination or microcracks.

Accordingly, there remains a need for a method to manufacture leadless semiconductor packages that does not have the above recited disadvantages and there remains a need for an improved leadless semiconductor package.

BRIEF SUMMARY OF THE INVENTION

In accordance with a first embodiment of the invention, there is provided a frame for a semiconductor package. The frame includes a plurality of leadframes arranged in a matrix and interconnected by connecting bars. Each leadframe includes leads and the connecting bars interconnect leads of adjacent leadframes to one another. The connecting bars have grooves disposed between the leads of the adjacent leadframes reducing the amount of metal to be cut by a saw blade during singulation.

In accordance with a second embodiment of the invention, there is provided a frame for a semiconductor package having a plurality of leadframes arranged in a matrix and interconnected by connecting bars. Semiconductor die are mounted on die pads circumscribed by inner lead ends of respective ones of the leadframes and the assembly then encapsulated with molding resin. The molded assembly is then cut along the connecting bars to singulate individual semiconductor packages. Each leadframe includes leads and the connecting bars interconnect leads of adjacent leadframes to one another. The connecting bars have reduced thickness portions between adjacent leads of each leadframe such that, after singulation, portions of the leads exposed on the sides of the semiconductor package have a larger profile height than the reduced thickness portions.

In accordance with a third embodiment of the invention, there is provided a method to manufacture a semiconductor package that includes the steps of providing a frame having a plurality of leadframes arranged in a matrix and interconnected by connecting bars, wherein each leadframe has a plurality of leads and the connecting bars interconnect leads of adjacent leadframes to one another; forming grooves in the connecting bars between adjacent leads of each leadframe to form reduced thickness portions; electrically connecting semiconductor die to the inner leads of respective ones of the leadframes; collectively encapsulating the leadframes and semiconductor die with a molding compound; and cutting the molding compound and frame along the connecting bars to singulate individual semiconductor packages wherein portion of the leads exposed on sides of the individual semiconductor packages have greater profile heights than the reduced thickness portions.

The details of one or more embodiments of the invention are set forth in the accompanying drawings and the description below. Other objects, features and advantages of the invention will be apparent from the description, drawings and claims.

BREIF DESCRIPTION OF THE DRAWINGS

FIG. 1 is a cross-sectional view of a portion of a leadframe matrix as known from the prior art before singulation.

FIG. 2 is a cross-sectional view of an outer lead portion of a semiconductor package following singulation from the leadframe matrix of FIG. 1.

FIG. 3 is a cross-sectional view of a semiconductor package having projecting reduced thickness outer lead portions as known form the prior art.

FIG. 6 is a bottom view of a leadframe component of the frame of FIG. 4.

FIG. 7 is a top view of a leadframe component of the frame of FIG. 6.

DETAILED DESCRIPTION

Figure 4:
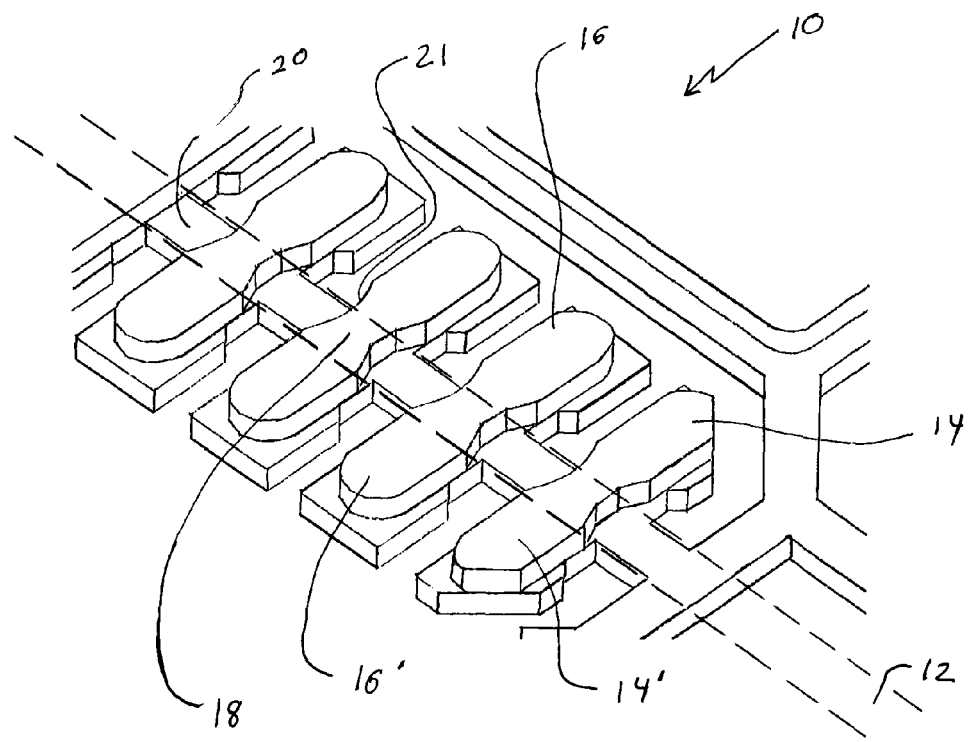
FIG. 4 is a partial perspective view of a frame of the present invention illustrating a saw line for singulation.
Figure 5:
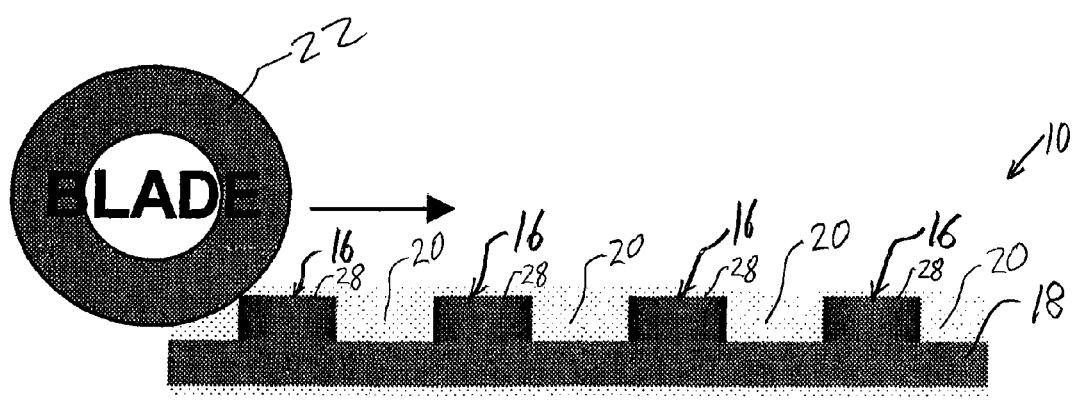
FIG. 5 is a partial profile view of the frame of FIG. 4.

FIG. 4 is a partial perspective view, and FIG. 5 a partial profile view, of a frame 10 of the present invention. The frame 10 is formed from an electrically conductive material, such as copper or a copper-base alloy. By copper-base, it is meant that alloy contains more than 50%, by weight, of copper. A saw track 12 illustrates the path a saw blade 22 will traverse to separate adjacent leadframes 14, 14'. Each leadframe 14 includes leads 16 and leads 16' of adjacent leadframes are connected to one another by connecting bars 18. As discussed hereinbelow, the connecting bars 18 are provided with grooves 20 reducing the amount of metal through which saw blade 22 must cut during singulation. The top side etching profile may optionally include an undercut 21 where the leads 16, 16' are connected prior to sawing. This undercut 21 reduces the amount of metal that will be removed during sawing and further minimizes the formation of side burrs.

FIG. 6 illustrates a bottom view of a leadframe 14 which is a component of a frame while FIG. 7 is a top view of the leadframe 14. Leadframe 14 includes a plurality of leads 16. A die pad 23 is disposed in a central aperture defined by inner ends of the leads 16. Extending from corners of the die pad 23 are tie bars 24. The tie bars 24 are formed as generally straight bars having protrusions 26 extending from an end opposing the die pad 23. As previously described, disposed around the perimeter of the leadframe 14 are connecting bars 18 to interconnect leads 16 to leads 16' of an adjacent leadframe. Saw track 12 extends along the connecting bar 18, in a direction generally perpendicular to the long axis of the leads.

Each lead 16 has a first lead surface 28 disposed on a bottom surface of the lead and a bond site 30 on a top surface of the lead. The leads 16 are spaced apart from each other and from the die pad 23 to electrically isolate the leads and die pad. In the illustrated embodiment, the leadframe 14 has eight leads 16 disposed on each of the four sides of the die pad 23. The reduced thickness portions of the leadframe 14 are indicated by cross-hatching in FIG. 6. For example, end portions of the leads 16 and perimeter of the die pad 23 may be reduced in thickness to form lips 32, 34 which help lock the die pad 23 and leads 16 in the molding resin. Also, the connecting bars 18 are provided with reduced thickness portions (grooves) 20 disposed between adjacent leads 16 of the leadframe 14.

It will be appreciated that the number and positioning of the leads may be modified as needed for a particular application. For example, the leadframe may include two sets of leads disposed on opposing sides of the die pad for use in a dual, no-lead, semiconductor package. Furthermore, it will be appreciated that the die pad may be eliminated for certain package configurations, such as for the flip-chip configuration of FIG. 11 discussed hereinbelow.

Figure 8:
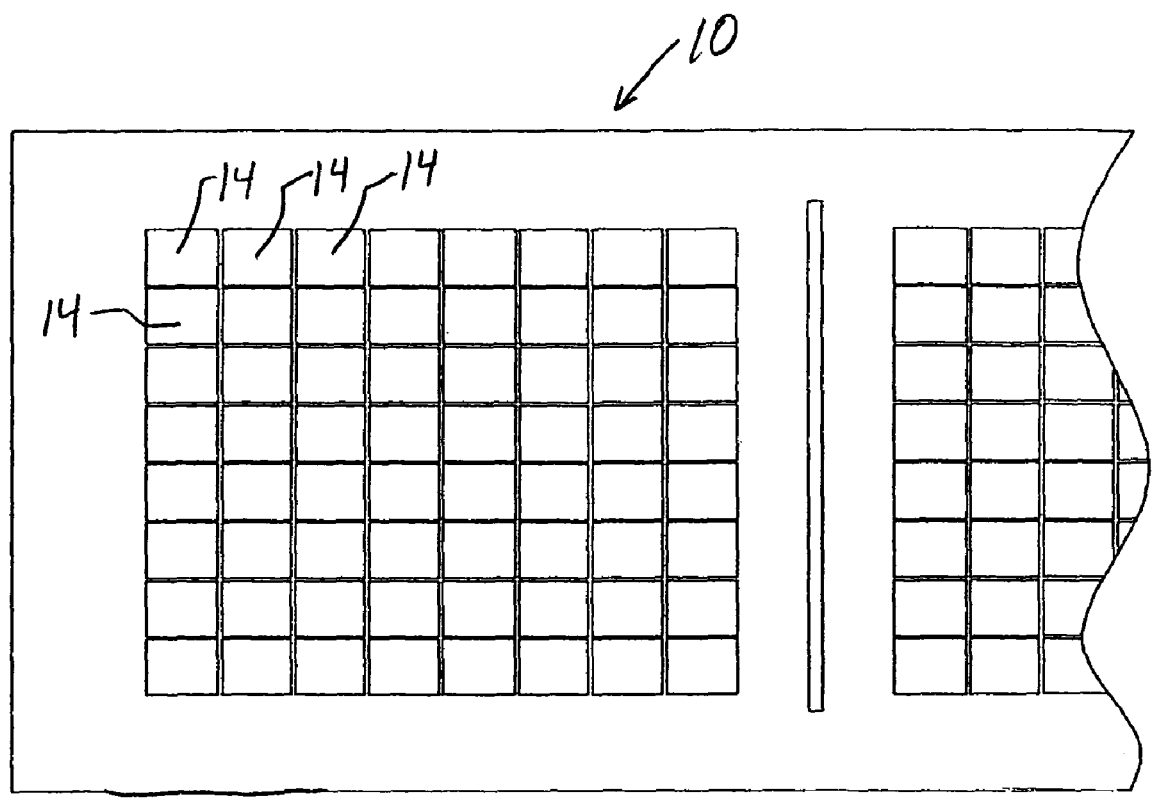
FIG. 8 is a schematic view of a frame of FIG. 4.

FIG. 8 is a schematic view of the frame 10. The frame includes a plurality of leadframes 14 arranged in a matrix. The illustrated matrix is an 8×8 matrix of leadframes, however the frame 10 may include any convenient number of leadframes in any desired array pattern.

Figure 9:
FIGS. 9A-9G depict semiconductor device packages of the invention during sequential manufacturing steps.

FIGS. 9A-9G depict semiconductor packages 50 of the invention during sequential manufacturing steps. In FIG. 9A, leadframe 14 is interconnected to an adjacent leadframe 14' by connecting bar 18. The sheet of electrically conductive material forming an array of leadframes 14, 14' has a profile height, "h", that is equal to a desired profile height for die pad 23 and leads 16. While FIG. 9A illustrates two interconnected leadframes, it is contemplated that any number of leadframes may be interconnected for the assembly of multiple packages.

The features of the leadframe 14, including die pad 23, leads 16, connecting bars 18 and tie bars 24, are formed by any known process such as stamping, chemical etching, laser ablation, or the like. The reduced thickness areas in each of those features is formed by a controlled subtractive process such as chemical etching or laser ablation. For example, each surface intended to form a contact surface of a lead 16, a full thickness portion of a connecting bar 18 and a center portion of a die pad 23 may be coated with a chemical resist and the remaining surfaces exposed to a suitable etching agent for a time effective to reduce the thickness of the exposed areas to a desired reduced thickness, "t". Typically reduced thicknesses are desired for the saw line portion of the connecting bars, the lips of the die pad and leads and for the tie bars. The reduced thickness, "t", may be between 30% and 70% of the thickness of the profile height "h" and more preferably is between 40% and 60% of the profile height.

Referring to FIG. 9B, after the leadframe 14 is formed, the bond sites 30 of the leads 16 and the bond sites 36 of the die pad 23 may be plated with a material to facilitate bonding with a bond wire. For example, the bond sites 30, 36 may be plated with one or more of nickel, palladium, gold, silver and other wire-bondable metals or metal alloys.

Referring to FIG. 9C, in preparation of wirebonding, the bottom surface 28 of each lead 16 and the bottom surface of the die pad 23 are secured to a surface 38. In the illustrated embodiment, the surface 38 if formed on an adhesive tape. Next, a semiconductor die 40 is secured to the die pad using a conventional bonding material such as solder, epoxy, double sided tape, or the like.

Referring to FIG. 9D, after the die 40 is secured to the die pad 23, bond wires 42 are connected between I/O pads 44 on a surface of the die 40 and bond sites 30 on the leads. In some embodiments, bond wires 42 also electrically interconnect an I/O pad to the die pad via bond site 36. Wirebonding may be by ultrasonic bonding, where a combination of pressure and ultrasonic vibration burst are applied to form a metallurgical cold weld, thermocompression bonding, where a combination of pressure and elevated temperature are applied to form weld, or thermosonic bonding where a combination pressure, elevated temperature and ultrasonic bursts are applied to form a weld. The wire 42 used in bonding is preferably, gold, a gold-base alloy, aluminum or an aluminum-base alloy. As an alternative to wirebonding, tape automated bonding (TAB) may be used.

The reduced thickness portions of the connecting bars 18 do not affect the stability of the leads 16 during wirebonding because the contacts 30 are adjacent a portion of the connecting bar 18 that has a thickness equal to the full profile height "h" of the leads 16. This is unlike prior-art arrangements where the removal of material between contacts of adjacent leadframes reduces the contact area between the contacts and the surface 38 making the leads relatively less stable during wirebonding.

Referring to FIG. 9E, after wirebonding is completed, the die 40, leadframe 14 and bond wires 42 are encapsulated with a molding compound 46. The molding compound is disposed about the package components by any convenient technique, such as transfer molding or injection molding. The molding compound 46 is an electrically insulating material such as a polymer molding resin, for example, an epoxy. A typical flow temperature for the polymer molding resin is between about 250° C. and about 300° C. Alternatively, the molding compound may be a low temperature thermal glass composite.

The reduced thickness of the tie bars 24 and of the lips 34 allows the molding compound 46 to be received under the tie bars 24 and lips 34 allowing tie bars and lips 34 to mechanically lock the die pad 23 in the molding compound 46 and help retain the die pad in the package. Similarly, lips 32 anchor the contacts 16 in the package.

Referring to FIG. 9F, after molding, the surface 38 is removed and bottom surfaces 28 of the contacts 16 may be plated with a material to facilitate electrical interconnection with external circuitry. For example, the bottom surfaces 28 may be plated with one or more of nickel, palladium, gold, silver, or other suitable material.

With reference to FIG. 9G, saw singulation or other suitable process is then used to cut through the molding compound 46 and the connecting bar 18 to separate adjacent lead frames 14, 14' and to form individual semiconductor packages. As best seen in FIGS. 4 and 5, the reduced thickness portions of the connecting bars 18 created by the grooves 20 reduce the amount of metal through which the saw blade 22 must pass when singulating the leadframes. Further, the grooves 20 create space between the exposed surfaces 28 of the leads 16. Even if the leads 16 are post-singulation plated, this space reduces or eliminates the possibility of burrs or smears causing shorting between leads.

With reference back to FIG. 9G, each semiconductor package 50 has a bottom (first) package face 52. an opposing top (second) package face 54 and package side faces 56 extending between the bottom package face 52 and the top package face 54. The package faces are formed in part by molding compound 46. The bottom surface of each lead 16 and the bottom surface of the die pad 22 are exposed on the bottom face 52 of the package 50.

Figure 10:
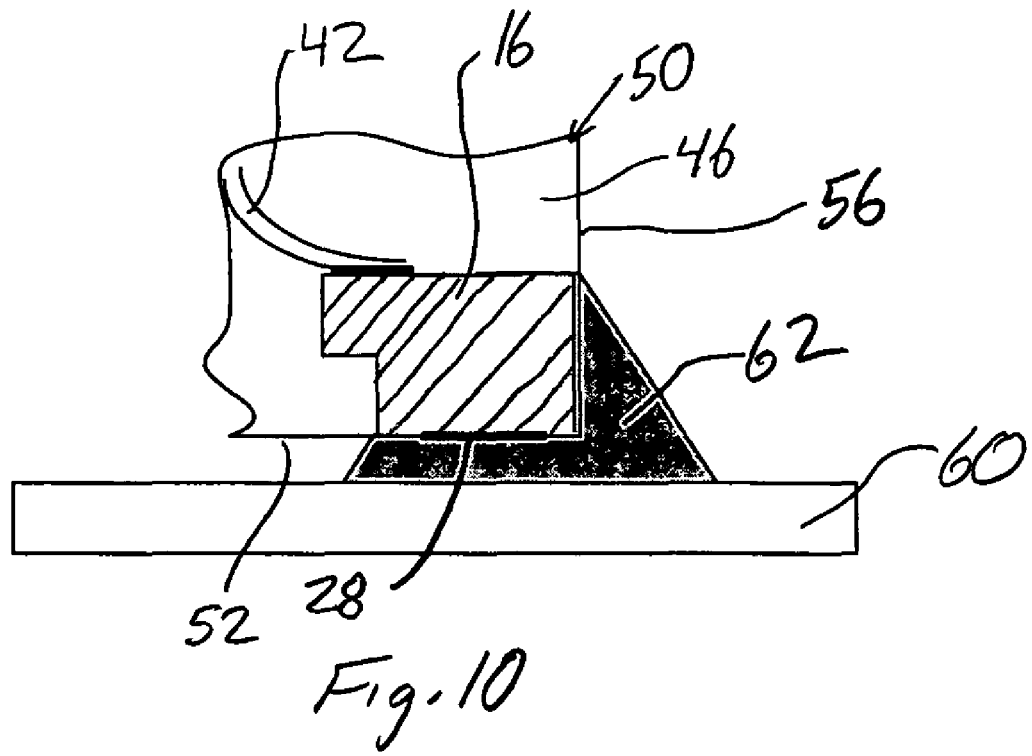
FIG. 10 is a partial cross-sectional view of a semiconductor package of the invention mounted to a printed circuit board.

The package 50 may be electrically coupled to an external circuit, such as a printed circuit, flex circuit, another semiconductor package, a test device or other component or device. As depicted in FIG. 10, the package 50 may be soldered to a printed circuit board 60. Advantageously, the portion of the lead 16 exposed at the side surface 56 of the package 50 is the full profile height of the lead 16, enabling a full height solder fillet 62 during board mounting. Comparing the prior art fillets of FIGS. 2 and 3 to the fillet of FIG. 10 shows that the lead 16 of the invention has a greater contact area (exposed area) on both the bottom surface 52 and the side surface 56 of the package 50 improving board mounting integrity over that achieved by the prior art. Further, the contact 16 of the invention provides a more visible solder fillet 62 which makes inspection easier than with prior art fillets that either lack or have a reduced visible fillet.

Figure 11:
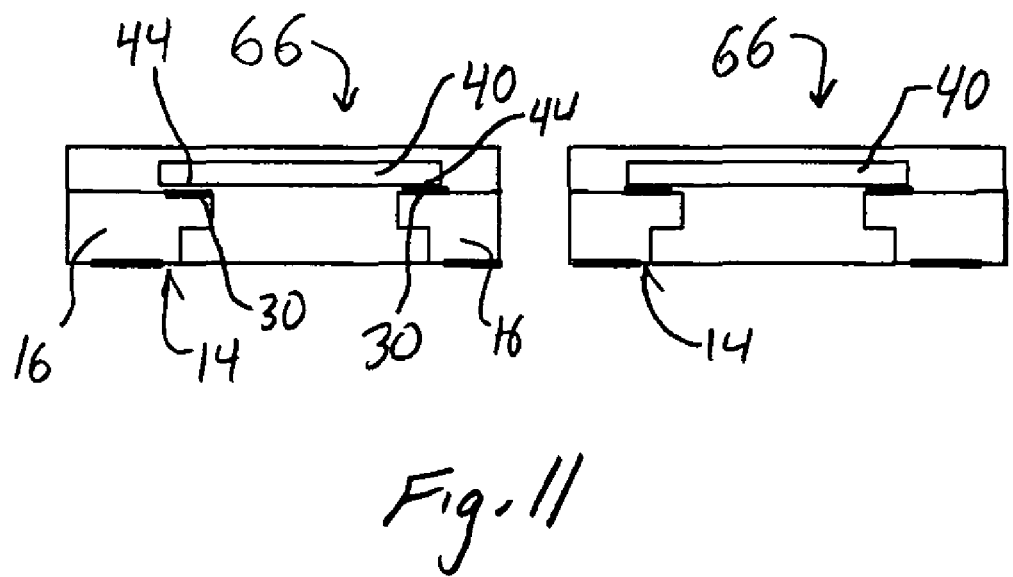
FIG. 11 illustrates an alternative semiconductor package of the invention where the semiconductor die is connected to a leadframe by flip-chip bonding.

Referring to FIG. 11, in an alternative embodiment of the invention, semiconductor device packages 66 including integrated circuit devices 40 are connected to the leadframes 14 by a flip-chip bond. These packages are substantially similar to the packages shown in FIG. 9 and may be formed using the same method with the exception that the die pad 23 and wires 42 of FIG. 9 have been eliminated and the I/0 pads 44 on the chip are electrically interconnected to the bond sites 30 on the leads 16 by soldering or the like.

In general, the frame of the present invention includes a plurality of leadframes interconnected by connecting bars which are provided with grooves disposed between adjacent leads of each leadframe to reduce the amount of metal through which a saw blade must pass when singulating packages. Furthermore, the grooves create space between exposed leads reducing or eliminating the possibility of burrs or smears causing shorting between leads. The grooves do not affect the stability of the leads during electrical interconnection of the leads to an integrated circuit device, ensuring consistent bond integrity. Also, the resulting package has full lead material exposed on the side allowing for a solder fillet during board mounting.

While described in terms of encapsulating integrated circuit devices, the packages of the invention may also be used to encapsulate hybrid devices where one or more passive or optical devices are coupled to one or more integrated circuit devices on a single die pad.

A number of embodiments of the present invention have been described. Nevertheless, it will be understood that various modification may be made without departing from the spirit and the scope of the invention. Accordingly, other embodiments are within the scope of the claims that follow.

What is claimed is:

1. A method for the manufacture of a package to encase a semiconductor package, comprising the steps of:

(a) providing an electrically conductive frame having a first side and an opposing second side and having a plurality of leadframes arranged in a matrix, each leadframe having a plurality of spaced leads extending outwardly from a central aperture, said electrically conductive frame further having a plurality of connecting bars joining outer end portions of adjacent ones of said leadframes;

(b) forming a groove in at least one of said connecting bars to form a reduced thickness portion therein between adjacent leads at the first side of the frame, the reduced thickness portion of the connecting bar disposed between full thickness portions of the connecting bar intersecting the outer end portions;

(c) forming a profile in the leads, wherein
each lead has a full thickness portion and a reduced thickness portion at the first side of the frame,
the reduced thickness portion extending beyond the full thickness portion in a first direction along the connecting bar and in a second direction transverse thereto,
the full thickness portion including the outer end portion, said full thickness portions of the connecting bar connecting opposing outer end portions of leads of adjacent leadframes in the second direction,
the profile in the leads providing an undercut with respect to the first side of the frame;

(d) electrically coupling a semiconductor device to inner portions of said leads at the first side of the frame;

(e) encapsulating said frame and semiconductor devices with a molding compound; and (f) cutting said molding compound and frame along said connecting bar and along a path through alternating reduced thickness portions and full thickness portions of the connecting bar, the path being substantially equidistant between adjacent apertures, to form singulated semiconductor packages having outer lead portions with a height greater than the height of said reduced thickness portion.

2. The method of claim 1 wherein said groove and said profile are formed by chemical etching from the second side of said frame.

3. The method of claim 2 wherein said cutting step (f) is by saw singulation.

4. The method of claim 3 wherein said saw singulation step causes a side portion of said outer lead portions to constitute a portion of a peripheral surface of said semiconductor package.

5. The method of claim 4 wherein said side portion of said outer lead portions have a height equivalent to the height of said frame.

6. The method of claim 4 wherein said side portions constituting said peripheral portions are coated with a metal to enhance solder wetting.

7. The method of claim 2 wherein said frame further includes a die pad disposed within said center aperture and said semiconductor device is bonded to said die pad.

8. The method of claim 7 wherein said chemical etching step further forms a lip on at least one of said leads and said die pad.

9. The method of claim 2 wherein said semiconductor device is bonded directly to inner end portions of said leads.

10. The method of claim 2 wherein said groove reduces the thickness of said reduced thickness portion to from 30% to 70% of the thickness of said frame.

11. An electrically conductive frame for a semiconductor package, comprising:
a plurality of leadframes arranged in a matrix, each leadframe having a first side and an opposing second side and having a plurality of spaced leads extending outwardly from a central aperture; and
a plurality of connecting bars each joining outer end portions of adjacent ones of said leadframes, each connecting bar including a region between adjacent leads where no leads join the bar,
wherein
each of the leads has a full thickness portion and a reduced thickness portion at the first side of the leadframe, the reduced thickness portion extending beyond the full thickness portion in a first direction along the connecting bar and in a second direction transverse thereto, and
a groove extends into said region of each said connecting bar and is disposed between adjacent leads of each said leadframe so that, along an axis in the first direction equidistant between adjacent apertures, each said connecting bar has, in said region, a thickness less than that of the full thickness portion of the leads, and in portions intersecting the leads and thereby connecting opposing outer end portions of leads of adjacent leadframes in the second direction, a thickness equal to that of the full thickness portion of the leads.

12. The electrically conductive frame of claim 11 wherein said a portion of said connecting bar underlying said groove has a thickness that is from 30% to 70% of the thickness of said electrically conductive frame.

13. The electrically conductive frame of claim 12 further including a die pad disposed within said central aperture.

14. The electrically conductive frame of claim 13 wherein at least one of said die pad and said leads includes a reduced thickness lip around a perimeter thereof.

* * * * *